(12) United States Patent
Liu et al.

(10) Patent No.: US 10,136,552 B2
(45) Date of Patent: Nov. 20, 2018

(54) WATER BLOCK FOR WATER-COOLING CPU RADIATOR

(71) Applicant: BEIJING DEEPCOOL INDUSTRIES., LTD., Beijing (CN)

(72) Inventors: Lei Liu, Beijing (CN); Haibo Yu, Beijing (CN); Edward Xia, Beijing (CN)

(73) Assignee: BEIJING DEEPCOOL INDUSTRIES CO., LTD., Beijing (CN)

( * ) Notice: Subject to any disclaimer, the term of this patent is extended or adjusted under 35 U.S.C. 154(b) by 0 days.

(21) Appl. No.: 15/500,844

(22) PCT Filed: Oct. 22, 2014

(86) PCT No.: PCT/CN2014/089128
§ 371 (c)(1),
(2) Date: Jan. 31, 2017

(87) PCT Pub. No.: WO2016/015388
PCT Pub. Date: Feb. 4, 2016

(65) Prior Publication Data
US 2017/0215301 A1 Jul. 27, 2017

(30) Foreign Application Priority Data

Aug. 1, 2014 (CN) .......................... 2014 1 03772418
Sep. 28, 2014 (CN) .......................... 2014 1 05104280

(51) Int. Cl.
*F28F 7/00* (2006.01)
*H05K 7/20* (2006.01)
(Continued)

(52) U.S. Cl.
CPC ............ *H05K 7/20272* (2013.01); *G06F 1/20* (2013.01); *H01L 23/473* (2013.01); *H05K 7/20263* (2013.01)

(58) Field of Classification Search
CPC .. H05K 7/20272; H05K 7/20263; G06F 1/20; G06F 1/206; G06F 2200/201; G06F 1/203
(Continued)

(56) References Cited

U.S. PATENT DOCUMENTS

| 2010/0142145 A1* | 6/2010 | Suzuki | .................... | G06F 1/203 361/689 |
| 2011/0100612 A1* | 5/2011 | Tang | ......................... | G06F 1/20 165/104.33 |
| 2013/0294946 A1* | 11/2013 | Su | .............................. | F04B 9/04 417/319 |

* cited by examiner

*Primary Examiner* — Davis Hwu
(74) *Attorney, Agent, or Firm* — Ference & Associates LLC

(57) ABSTRACT

The present invention provides a water block for a water-cooling CPU radiator. The water block includes an upper shell, a bottom shell, an external pipe and a water pump. The upper shell includes a shell body and an upper cover. The shell body is provided with a first cavity, a side wall of the shell body is provided with a water outlet. The upper cover is provided with a water inlet, and both the water inlet and the water outlet are in fluid communication with the first cavity. The bottom shell is arranged at the lower end of the shell body and is provided with a second cavity, and the two sides of the bottom shell are provided with an upper water port and a water inlet, respectively, which are communicated with the second cavity. The external pipe is arranged outside the upper shell and the bottom shell.

9 Claims, 6 Drawing Sheets

(51) Int. Cl.
*G06F 1/20* (2006.01)
*H01L 23/473* (2006.01)
(58) Field of Classification Search
USPC .......................................................... 165/80.4
See application file for complete search history.

WATER BLOCK FOR WATER-COOLING CPU RADIATOR

TECHNICAL FIELD

The present invention relates to the field of heat dissipation of computers, in particular to a water block for a water-cooling CPU radiator.

BACKGROUND OF RELATED ART

As is well known, an integrated circuit inside a computer can generate a lot of heat, which not only can result in instability of system operation to shorten the service life, but also may burn up some components, so a radiator is required to absorb such heat so as to ensure a normal temperature of computer components. There are many types of radiators, the most common one of which is a CPU radiator. At present, CPU radiators take the forms of air cooling type, water cooling type and the like. Besides, a radiator fan may also be arranged in a water-cooling radiator to assist heat dissipation so as to improve the radiating effect.

However, in a conventional water-cooling CPU radiator, a water pump unit is used to circulate a coolant within a closed system. The closed system includes a heat exchanger, and the coolant circulates through the heat exchanger, but the liquid cooling design involves many elements, which increases the overall installation time and results in a low radiating efficiency, such that a normal temperature range of the computer components can hardly be ensured, or the air tightness is poor so that the coolant is likely to leak and cause damage to parts, and complicated disassembly has to be conducted when maintenance is needed.

The information disclosed in the background part is only intended to enhance understanding of the general background of the present invention, and should not be regarded as admission or suggestion in any form that such information constitutes the prior art well known to those of ordinary skill in the art.

SUMMARY OF THE INVENTION

The object of the present invention is to provide a water block for a water-cooling CPU radiator, which is obvious in radiating effect, low in cost, convenient to install, and simple to use.

In order to achieve the above object, the present invention provides a water block for a water-cooling CPU radiator. The water block includes an upper shell, a bottom shell, an external pipe and a water pump. The upper shell includes a shell body and an upper cover. The shell body is provided with a first cavity, a side wall of the shell body is provided with a water outlet. The upper cover is arranged at the upper end of the shell body and is provided with a water inlet, and both the water inlet and the water outlet are in fluid communication with the first cavity. The bottom shell is arranged at the lower end of the shell body and is provided with a second cavity, and the two sides of the bottom shell are provided with an upper water port and a water inlet, respectively, which are communicated with the second cavity. The external pipe is arranged outside the upper shell and the bottom shell, and two ends of the external pipe are communicated with the upper water port and the water inlet, respectively. The water pump includes a motor and an impeller, the motor is provided with an electromagnetic coil and a rotor, the rotor and the impeller are fixed together and are arranged in the first cavity. The electromagnetic coil is arranged in an accommodating space between the shell body and the bottom shell, and the motor is used for driving the impeller to rotate; and the water inlet and the water outlet are used for communicating with a circulating coolant.

Preferably, the impeller and the rotor are integrally formed. The bottom surface of the first cavity protrudes outwards to form an accommodating cavity for the rotor, and the rotor is rotationally arranged in the accommodating cavity. The electromagnetic coil is arranged on the outer wall of the accommodating cavity, and the magnetic force of the electromagnetic coil can penetrate through the wall of the accommodating cavity and drive the rotor to rotate.

Preferably, the upper cover is embedded in the upper end surface of the shell body, a sealing strip is arranged between the upper cover and the upper end surface of the shell body, and the upper cover and the upper end of the shell body are fixed together through bolts.

Preferably, the water block further includes a housing that is connected with the upper cover, the lower edge of the housing and the upper edge of the shell body are connected together, and the external pipe penetrates through the housing to be communicated with the water inlet; and the upper end of the housing is provided with a round opening, a plurality of radiating fins are arranged around the external pipe inside the housing, the bottom ends of the plurality of radiating fins are fixed together with the upper end of the upper cover through connecting pieces, and the upper ends of the plurality of radiating fins protrude out of the round opening.

Preferably, the bottom shell includes a cover body and an absorber plate, the absorber plate is arranged at a lower opening end of the cover body, a side wall of the absorber plate forms a lower edge of the bottom shell, the upper water port and the water inlet are formed on two sides of the top wall and are opened outwards, the upper water port and the water inlet extend inwards to form pipe connecting sections, respectively, and the pipe connecting sections protrude out of the top wall of the cover body and are communicated with the inside of the bottom shell.

Preferably, the lower end of the shell body and the upper end of the cover body are connected together through snap-fit or bolts.

Preferably, the cover body has a rectangular shape, and corners of the bottom end of the cover body are provided with lugs that have bolt holes. The water block further includes two fastening pieces, two ends of each fastening piece are provided with mounting holes and bend downwards, two end parts of each fastening piece are fixed on two lugs through bolts, and the middle part of each fastening piece is fit closely to the side wall of the cover body.

Preferably, the external pipe is a transparent pipe; and the circulating coolant is a visible liquid.

Preferably, the inner side of the absorber plate is provided a plurality of strip-shaped flow channels which are positioned inside the cover body and are arranged in a direction along the water inlet to the upper water port.

The present invention further provides a CPU radiator provided with the above water block. The CPU radiator further includes: a radiating part, in which a coolant circulating channel is provided; and a connecting pipe, through which the water inlet and the water outlet of the water block are communicated with the coolant circulating channel.

Compared with the prior art, the water block according to the present invention has the following beneficial effects: in the water block, the bottom shell and the upper shell are connected together through the external pipe to form a radiating system, the external pipe has an obvious radiating effect, the water block is low in cost, convenient to install, relatively low in requirements on maintenance, and simple to use; moreover, through the design of the fastening pieces, the water block may be used on multiple platforms, has a wide application range, and is simple and convenient.

DETAILED DESCRIPTION OF THE EMBODIMENT

Hereinafter, specific implementations of the present invention are described in detail with reference to the accompanying drawings; however, it should be understood that the protection scope of protection of the present invention is not restricted by the specific implementations.

Unless otherwise clearly defined, in the whole description and claims, the terms "comprise" or its variations such as "contain" or "include", etc. will be understood as including the stated elements or component parts without excluding other elements or other component parts.

Figure 1:
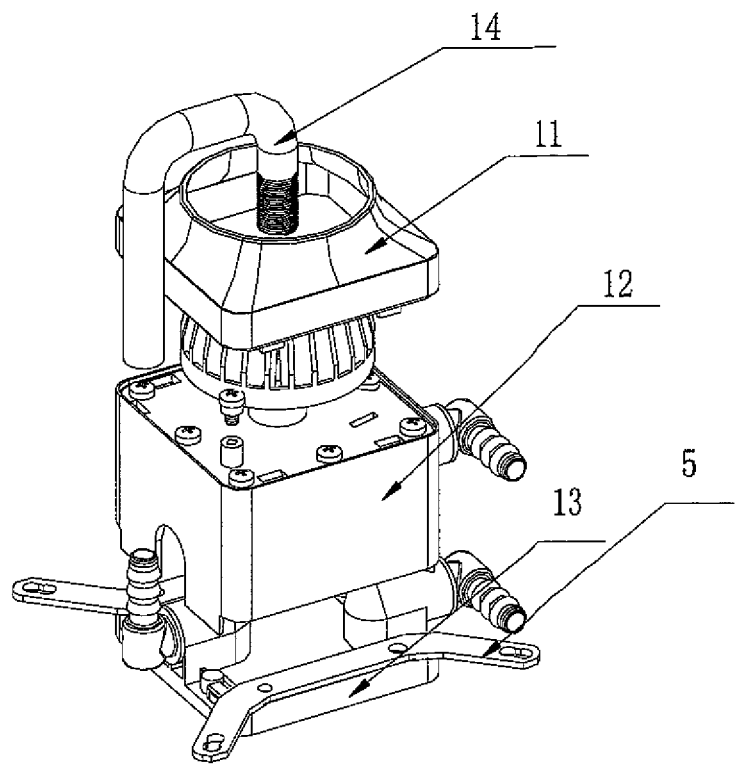
FIG. 1 is an assembly diagram of a water block for a water-cooling CPU radiator according to the present invention.
Figure 2:
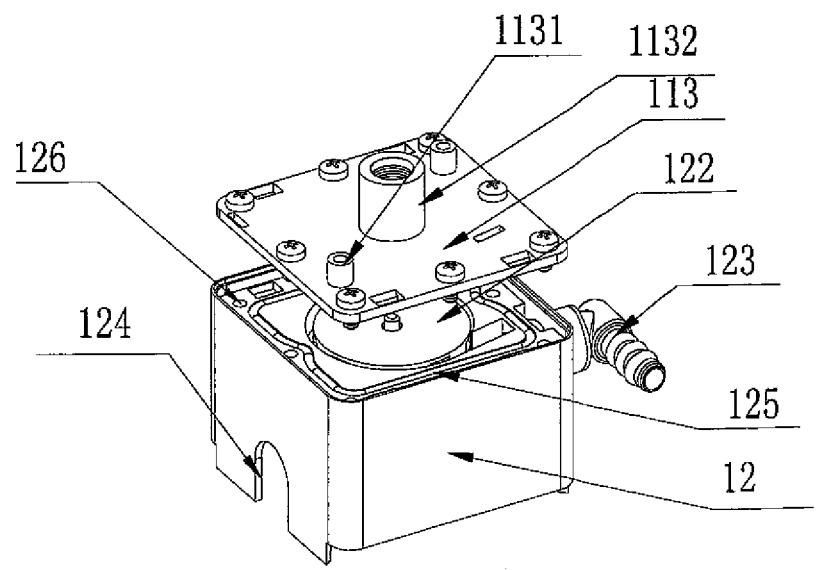
FIG. 2 is an assembly diagram of a shell body and an upper cover in the water block shown in FIG. 1.

FIG. 1 shows a water block 1 for a water-cooling CPU radiator according to a specific implementation of the present invention. The water block 1 includes an upper shell (including a shell body 12 and an upper cover 113, as shown in FIG. 2), a bottom shell 13, an external pipe 14 and a water pump, wherein the bottom shell 13 is used for contacting a heat source of a CPU processor, and the external pipe 14 is arranged outside the upper shell and the bottom shell 13 and communicates a coolant in the upper shell and the bottom shell 13 to enable the coolant in the bottom shell 13 to be conveyed, through the external pipe 14, into the upper shell for circulation. In use, the coolant in the bottom shell 13 performs heat exchange with the heat emitted by the CPU processor, then the coolant with heat radiates in a radiating part 3, and then flows back into the bottom shell 13 and continues to absorb heat (refer to FIG. 9), thereby achieving the aim of cooling the CPU processor, wherein the coolant is circulated under the drive of the water pump.

Figure 4:
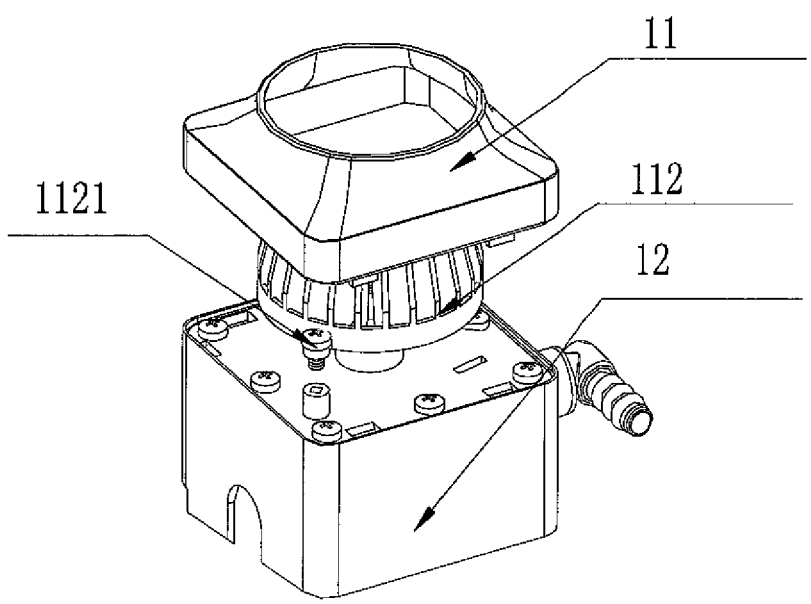
FIG. 4 is an assembly diagram of an upper shell, the cooling element and a housing in the water block shown in FIG. 1.

As a preferred embodiment, a housing 11 is arranged on the upper part of the upper cover 113 of the water block 1, the housing 11 and the upper cover 113 are connected together in a snap-fit mode (refer to FIG. 4), and when the housing 11 and the upper cover 113 are connected, the lower edge of the housing 11 and the upper edge of the shell body 12 are connected together. Hereinafter, the preferred embodiment will be described in detail.

Figure 10:
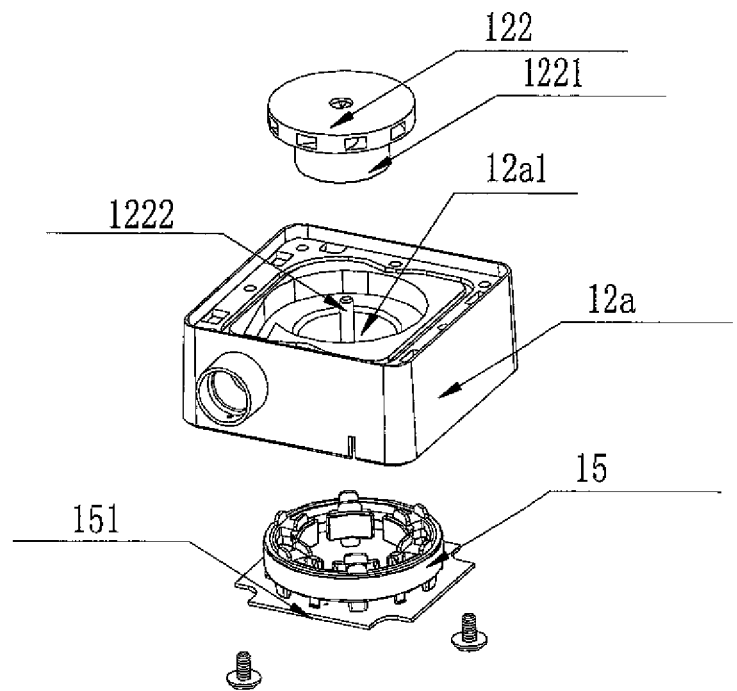
FIG. 10 is an installation diagram of a water pump for a water-cooling CPU radiator according to the present invention.

As shown in FIGS. 2 and 10, the shell body 12 has a first cavity (not marked in the figures.), and the side wall of the shell body 12 is provided with a water outlet 123 that is communicated with the first cavity. The upper end of the shell body 12 is hermetically connected with the upper cover 113; specifically, the upper cover 113 is embedded in the upper end surface of the shell body 12, a sealing groove 125 is formed around the upper end surface of the shell body 12, a sealing strip is arranged in the sealing groove 125, and mounting holes 126 are formed around the sealing groove 125. When the upper cover 113 is embedded in the upper end surface of the shell body 12, the upper cover 113 is fixed together with the upper end of the shell body 12 by screwing bolts into the mounting holes 126. Moreover, the upper cover 113 is provided with a water inlet 1132, and the water inlet 1132 is in fluid communication with the inside of the first cavity.

Figure 3:
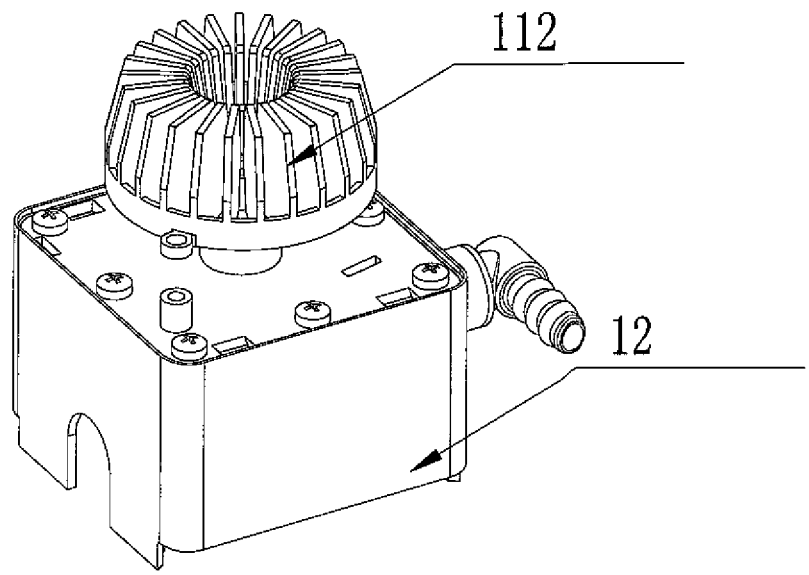
FIG. 3 is an assembly diagram the shell body and a cooling element in the water block shown in FIG. 1.

As shown in FIG. 3, the housing 11 is a plastic case. A cooling element 112 is arranged in the housing 11 and includes a plurality of radiating fins arranged around the external pipe that is arranged inside the housing, and the bottom ends of the radiating fins are fixed together with the upper end of the upper cover 113 through connecting pieces (not marked in the figure). Specifically, the upper end of the upper cover 113 is provided with a bolt post 1131, and the connecting pieces are directly fixed and locked on the bolt post 1131 through bolts 1121 (refer to FIG. 4). Moreover, the upper end of the housing 11 is provided with a round opening, a projection is arranged on the plastic case and is directly clamped into a groove of the upper cover 113, and this snap-fit connection is convenient and simple. At this moment, the upper ends of the plurality of radiating fins protrude out of the round opening and achieve an aesthetic effect at the same time. During assembly, the cooling element 112 and the upper cover 113 are assembled together at first, then the assembled part is mounted to the upper end of the shell body 12 (refer to FIG. 3), and finally, the housing 11 is placed above the cooling element 112 (refer to FIG. 4).

Figure 5:
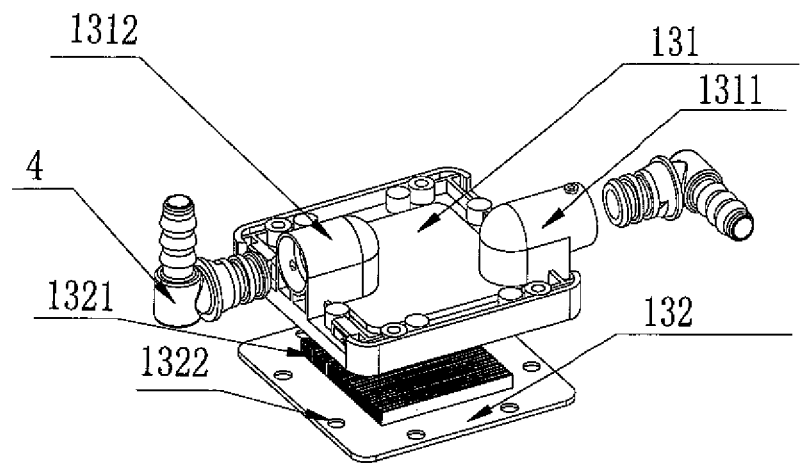
FIG. 5 is an assembly diagram of a bottom shell in the water block shown in FIG. 1.

As shown in FIG. 5, the bottom shell 13 is arranged at the lower end of the shell body 12 and is provided with a second cavity, and the two sides of the bottom shell 13 are provided with an upper water port and a water inlet, respectively, which are communicated with the second cavity. A pipe connecting section 1312 and a pipe connecting section 1311 corresponding to the upper water port and the water inlet are marked in the FIG. 5, and in this embodiment, the bottom shell 13 may be formed by the combination of a cover body 131 and an absorber plate 132. The cover body 131 is made of plastic, the absorber plate 132 is made of a copper plate, the absorber plate 132 is arranged at a lower opening end of the cover body 131, the side wall of the absorber plate 132 forms the lower edge of the bottom shell 13. The cover body 131 and the absorber plate 132 hermetically define a second cavity. The upper water port and the water inlet are arranged on two sides of the top wall of the cover body 131 and are opened outwards. The upper water port and the water inlet extend inwards to form pipe connecting sections, respectively (as shown in FIG. 5, the pipe connecting section corresponding to the upper water port is marked as 1312, and the pipe connecting section corresponding to the water inlet is marked as 1311), and the pipe connecting sections protrude out of the top wall of the cover body 131 and are communicated with the inside (the second cavity) of the bottom shell 13. Moreover, a plurality of strip-shaped flow channels 1321 are formed on the inner side of the absorber plate 132, positioned inside (the second cavity) of the cover body, and arranged in a direction along the water inlet to the upper water port, and the strip-shaped flow channels can enable water flow in the second cavity to fully contact the absorber plate 132 so as to absorb heat.

Furthermore, a part at the lower end of the shell body 12 corresponding to the pipe connecting section is provided with a receding notch 124 (refer to FIG. 3), and the lower end of the shell body 12 and the upper end of the cover body 131 are connected. Meanwhile, the edges of the other two sides of the top wall of the cover body 131 are provided fastening pieces 5 (refer to FIG. 1), two ends of each fastening piece 5 extend outwards, and the middle part of each fastening piece 5 is clamped between the edge of the top wall of the cover body 131 and the lower side wall of the shell body (refer to FIG. 9). The external pipe 14 may be made of an aluminum pipe, a copper pipe and a heat-resistant hose or a heat-resistant hard pipe, and it penetrates through the housing 11 to be communicated with the water inlet and is fixed together with the upper cover 113; the water inlet and the water outlet 123 are used for communicating with the circulating coolant; the heat in the bottom shell 13 may be transferred into the upper shell through the external pipe 14; and the coolant, driven by a water pump, can circulate between the bottom shell 13 and the upper shell. As a preferred embodiment, the external pipe 14 is made of a transparent material, and in this case, a visible liquid such as added with fluorescent powder can be used as the circulating coolant, so that the circulating state of the coolant may be observed conveniently, and then the working condition of the water block can be judged conveniently. Moreover, pipe joints 4 (refer to FIG. 5) are arranged at the upper water port, the water outlet and the water inlet to facilitate connection.

Figure 6:
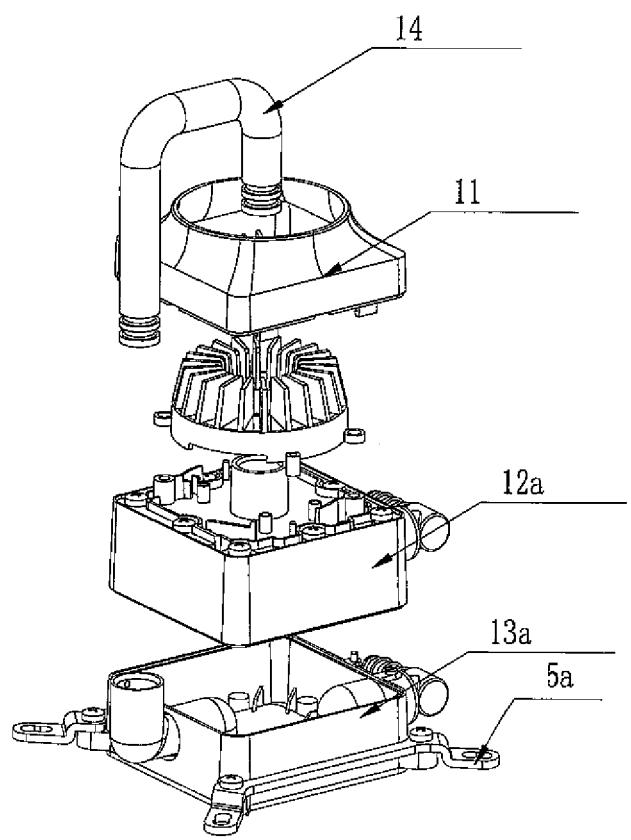
FIG. 6 is an assembly diagram of another water block for a water-cooling CPU radiator according the present invention.
Figure 7:
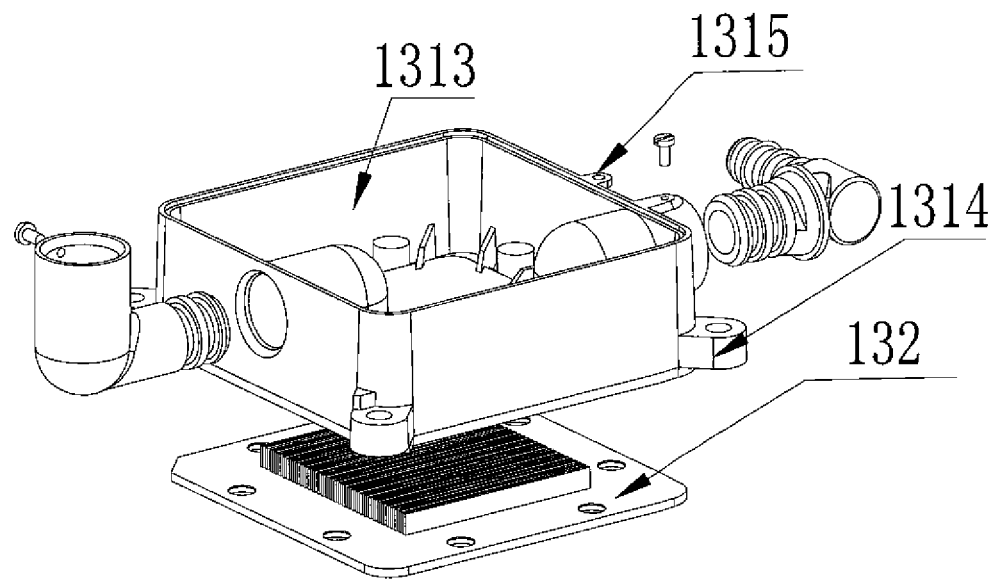
FIG. 7 is an assembly diagram of a bottom shell in the water block shown in FIG. 6.
Figure 8:
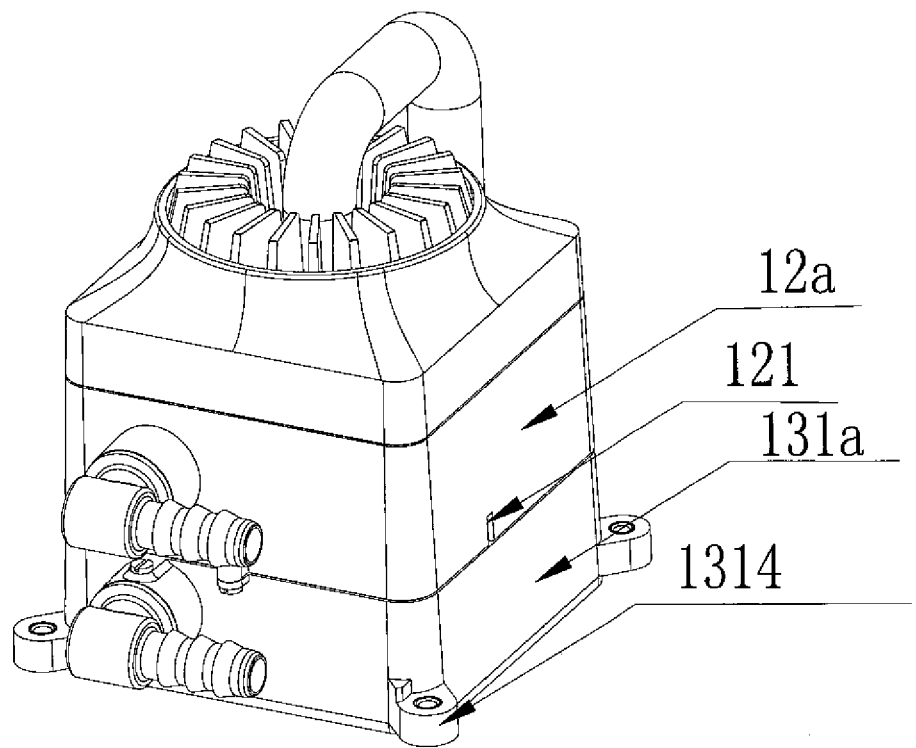
FIG. 8 is a schematic structural diagram of another water block for a water-cooling CPU radiator according the present invention.

As shown in FIGS. 6 to 8, in this embodiment, the connection between the lower end of the shell body 12 and the upper end of the cover body 131 may be changed in such a manner that the edge of the top wall of the original cover body 131 is extended upwards to form a connecting wall 1313 (refer to FIG. 7) so as to form a cover body 131a (refer to FIG. 8), in this case the cover body 131a and the absorber plate 132 are combined to form another bottom shell 13a (refer to FIG. 6), and correspondingly, the upper water port and the water inlet extend inwards to form pipe connecting sections, respectively (as shown in FIG. 5, the pipe connecting section corresponding to the upper water port is marked as 1312, and the pipe connecting section corresponding to the water inlet is marked as 1311), which penetrate through the connecting wall 1313, and a first lug 1315 provided with a bolt hole is arranged at the outer side of the upper edge of the connecting wall 1313; furthermore, the lower side wall part (the part with the receding notch 124) of the original shell body 12 is removed to form a shell body 12a (refer to FIG. 6), a second lug (refer to FIG. 8) corresponding to the first lug 1315 is also arranged at the outer side of the lower side wall of the shell body 12a, so that the lower end of the shell body 12a and the upper end of the cover body 131a are directly connected, and then fixed connection of the shell body 12a and the cover body 131a may be achieved by passing bolts (not marked in the figures) through the two lugs. In this way, a design of a snap-in structure of the lower end of the shell body 12 and the upper end of the cover body 131 is not needed, and the connection is simple.

Furthermore, in this embodiment, the cover body 131a may be designed as a square body, a lug 1314 with a bolt hole is arranged at each corner of the bottom end of the cover body 131a to fix a fastening piece 5a, and in this case, two ends of the fastening piece 5a are provided with mounting holes and bend downwards (refer to FIG. 6), the two end parts of the fastening piece 5a are fixed on two lugs 1314 through bolts (not marked in the figure), and moreover, the middle part of the fastening piece 5a is fit closely to the side wall of the cover body 131a. In this embodiment, the fastening piece 5a is fixed through the bolts, and is convenient to replace. Furthermore, a main board connection hole 121 (refer to FIG. 8) for controlling the water pump is formed in the side wall of the shell body 12a.

Figure 9:
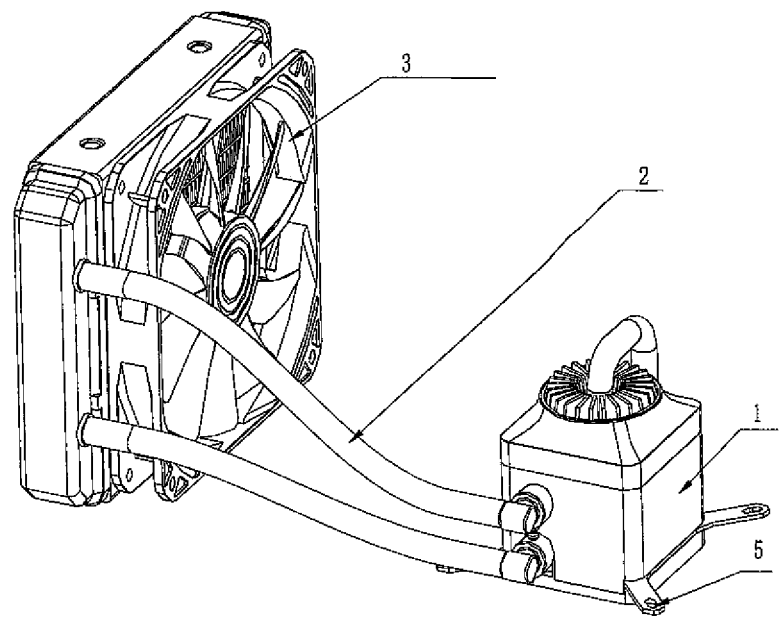
FIG. 9 is a connection diagram of a CPU radiator according to the present invention.

As shown in FIG. 9, this embodiment further provides a CPU radiator provided with the water block 1, and the CPU radiator further includes a radiating part 3 and a connecting pipe 2, the inside of the radiating part 3 is provided with a coolant circulating channel, the radiating part 3 may use a fan to assist radiating, and the connecting pipe 2 communicates the water inlet and the water outlet 123 of the water block with the coolant circulating channel. In use, the absorber plate 132 is mounted on a heating element of a central processing unit (CPU) of a computer system through the fastening piece 5, and the radiating part 3 is fixed on a computer case and then is connected to a power source to finish installation. Under the action of the water pump, the internal coolant starts to flow between the first cavity and the second cavity through the external pipe 14, and through the flowing of the coolant, the heat on the bottom shell 13 may be transferred to the radiating part 3 through the connecting pipe 2, the radiating part 3 cools the coolant, and then the cooled coolant flows into the water inlet again to finish one radiation.

Figure 11:
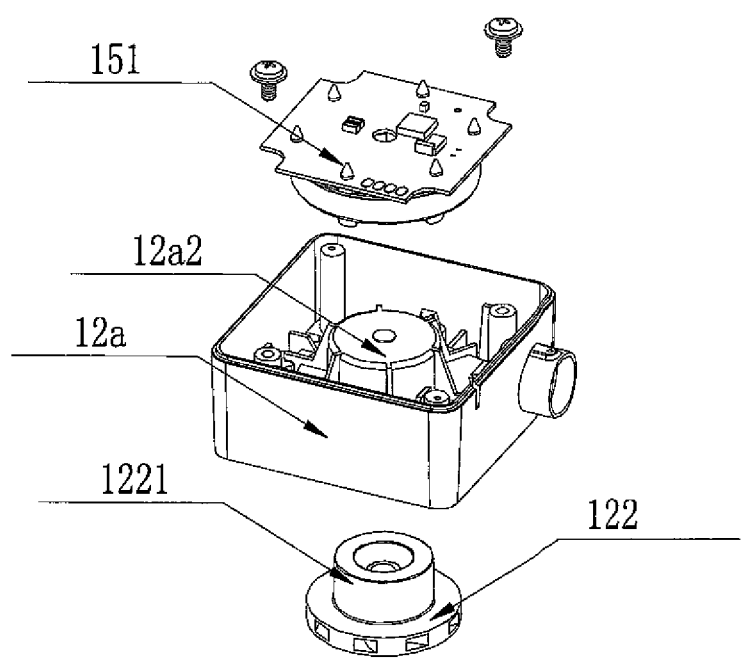
FIG. 11 is another installation diagram of the water pump for the water-cooling CPU radiator according to the present invention.

As shown in FIGS. 10 and 11, the water pump in this embodiment includes a motor provided an electromagnetic coil 15 and a rotor 1221, and an impeller 122, which are specifically arranged as follows. As mentioned above, although the connection between the shell body and the bottom shell may be achieved in different ways, in this embodiment the electromagnetic coil 15 is arranged between the shell body and the bottom shell, and in this case, a space for installing the electromagnetic coil 15 must be reserved between the shell body and the bottom shell, and the electromagnetic coil 15 is isolated (for water-proof purpose) from the first cavity and the second cavity. This embodiment is described with the electromagnetic coil 15 arranged between the shell body 12a and the bottom shell 13a as an example, and specifically, the impeller 122 and the rotor 1221 are integrally formed, the bottom surface of the first cavity protrudes downwards to form an accommodating cavity 12a1 matched with the rotor 1221, the accommodating cavity wall of the accommodating cavity 12a1 is in the form of a columnar shell, the electromagnetic coil 15 is arranged on the outer wall 12a2 of the columnar shell of the accommodating cavity 12a1 (refer to FIG. 11), the magnetic force of the electromagnetic coil 15 can penetrate through the accommodating cavity wall of the accommodating cavity and drive the rotor to rotate, a supporting shaft 1222 is arranged at the axis center of the accommodating cavity 12a1, the rotor 1221 is rotationally arranged on the supporting shaft 1222, and at this moment, the rotor 1221 is just accommodated in the accommodating cavity 12a1, the electromagnetic coil 15 is controlled by a circuit board 151 to work, and after a power source is switched on, the electromagnetic coil 15 can drive the rotor 1221 to cause the impeller 122 to rotate together.

In short, in the water block 1, the bottom shell 13 and the upper shell are connected together through the external pipe 14 to form a radiating system, the external pipe located outside has an obvious radiating effect, and the water block 1 is low in cost and convenient to install, has a relatively low requirement on maintenance, and is simple to use. Furthermore, through the design of the fastening pieces 5, the water block 1 may be used on multiple platforms, has a wide application range, and is simple and convenient.

The above description of the specific exemplary implementations of the present invention is only used for explanation and illustration. Such description is not intended to restrict the present invention to the disclosed precise form, and apparently, many modifications and variations may be made according to the above teaching. The object of selecting and describing exemplary embodiments is to explain specific principles and practical applications of the present invention so as to enable those skilled in the art to achieve and utilize various different exemplary implementations and various different selections and variations of the present invention. The scope of the present invention shall be defined by the claims and equivalents thereof.

What is claimed is:

1. A water block for a water-cooling CPU radiator, comprising:
   an upper shell, which comprises a shell body and an upper cover, wherein the shell body is provided with a first cavity, a side wall of the shell body is provided with a water outlet, the upper cover is arranged at the upper end of the shell body and is provided with a water inlet, and wherein both the water inlet and the water outlet are in fluid communication with the first cavity;
   a bottom shell arranged at the lower end of the shell body, wherein the bottom shell is provided with a second cavity, and the two sides of the bottom shell are provided with an upper water port and a water inlet, respectively, which are in fluid communication with the second cavity;
   an external pipe arranged at the outer side of the upper shell and the bottom shell, wherein the two ends of the external pipe are communicated with the upper water port and the water inlet, respectively; and
   a water pump comprising a motor and an impeller, wherein the motor is provided with an electromagnetic coil and a rotor, the rotor and the impeller are fixed together and arranged in the first cavity, the electromagnetic coil is arranged in an accommodating space between the shell body and the bottom shell, the motor is used for driving the impeller to rotate,
   wherein the water inlet and the water outlet are used for communicating with a circulating coolant;
   wherein the impeller and the rotor are integrally formed;
   the bottom surface of the first cavity protrudes outwards to form an accommodating cavity for the rotor, and the rotor is rotationally arranged in the accommodating cavity; and
   the electromagnetic coil is arranged on an outer wall of the accommodating cavity, and the magnetic force of the electromagnetic coil can penetrate through an accommodating cavity wall of the accommodating cavity and drive the rotor to rotate.

2. The water block for the water-cooling CPU radiator according to claim 1, wherein the upper cover is embedded in the upper end surface of the shell body, a sealing strip is arranged between the upper cover and the upper end surface of the shell body, and wherein the upper cover and the upper end of the shell body are fixed together through bolts.

3. The water block for the water-cooling CPU radiator according to claim 2, further comprising a housing which is connected with the upper cover, the lower edge of the housing and the upper edge of the shell body are connected together, and the external pipe penetrates through the housing to be communicated with the water inlet; and
   wherein the upper end of the housing is provided with a round opening, a plurality of radiating fins are arranged around the external pipe inside the housing, the bottom ends of the plurality of radiating fins are fixed together with the upper end of the upper cover through connecting pieces, and the upper ends of the plurality of radiating fins protrude out of the round opening.

4. The water block for the water-cooling CPU radiator according to claim 1, wherein the bottom shell comprises a cover body and an absorber plate arranged at a lower opening end of the cover body, a side wall of the absorber plate forming a lower edge of the bottom shell, wherein the upper water port and the water inlet are formed on two sides of the top wall of the cover body and are opened outwards, the upper water port and the water inlet extend inwards to form pipe connecting sections, respectively, and wherein the pipe connecting sections protrude out of the top wall of the cover body and are communicated with the inside of the bottom shell.

5. The water block for the water-cooling CPU radiator according to claim 4, wherein the lower end of the shell body and the upper end of the cover body are connected together through snap-fit or bolts.

6. The water block for the water-cooling CPU radiator according to claim 5, wherein the cover body has a rectangular shape, and lugs which are provided with bolt holes are arranged at corners of the bottom end of the cover body; and
   the water block further comprises two fastening pieces, the two ends of each fastening piece are provided with mounting holes and bend downwards, the two end parts of the fastening piece are fixed on two lugs through bolts, and the middle part of each fastening piece is fit closely to the side wall of the cover body.

7. The water block for the water-cooling CPU radiator according to claim 1, wherein the external pipe is a transparent pipe; and
   wherein the circulating coolant is a visible liquid.

8. The water block for the water-cooling CPU radiator according to claim 1, wherein a plurality of strip-shaped flow channels are arranged on the inner side of the absorber plate inside the cover body, and arranged in a direction along the water inlet to the upper water port.

9. A CPU radiator provided with the water block according to claim 1, comprising:
   a radiating part, in which a coolant circulating channel is provided; and
   a connecting pipe, through which the water inlet and the water outlet of the water block are in fluid communication with the coolant circulating channel.

* * * * *